United States Patent [19]
Arden

[11] Patent Number: 4,992,949

[45] Date of Patent: Feb. 12, 1991

[54] COLOR SORTING OF LUMBER

[75] Inventor: Terence J. Arden, Vancouver, Canada

[73] Assignee: MacMillan Bloedel Limited, Vancouver, Canada

[21] Appl. No.: 367,622

[22] Filed: Jun. 16, 1989

Related U.S. Application Data

[63] Continuation-in-part of Ser. No. 302,337, Jan. 27, 1989, abandoned.

[51] Int. Cl.[5] .................... G06F 15/20; G01R 27/00

[52] U.S. Cl. .................... 364/478; 209/518; 209/582; 250/563; 356/237; 364/550

[58] Field of Search .................... 364/474.09, 474.13, 364/428, 550, 551.01; 209/517, 518, 580, 581, 582; 250/563, 226, 223 R, 572; 356/414, 416, 237, 425; 382/1

[56] References Cited

U.S. PATENT DOCUMENTS

| | | | |
|---|---|---|---|
| 4,260,062 | 4/1981 | Lockett | 209/582 |
| 4,879,752 | 11/1989 | Aune | 209/517 X |
| 4,926,350 | 5/1990 | Bechtel et al. | 209/517 X |
| 4,940,850 | 7/1990 | Satake | 209/580 |

*Primary Examiner*—Joseph Ruggiero

[57] ABSTRACT

A system for sorting lumber using a scanning camera that generates separate red, green and in some cases blue outputs to scan selected length increments along the surface of a piece of lumber and such data collected for each color is each separately histogrammed to produce a frequency distribution of color intensity. The data is analyzed to determine the mean values for each color in the selected lengths and the lengths characterized based on these mean values into specific colors. The lumber pieces may be automatically severed into pieces having significant differences in color and the pieces of significantly different colors may be automatically collected in different groupings. In an alternative arrangement the histogram for selected color is analyzed to determine the frequency distribution and degree of frequency variability to determine if it is to be classified as vertical or flat grained. The lumber pieces may be automatically severed into pieces whenever their classification changes between flat and vertical grain and the pieces of flat grain may be automatically collected separate from those of vertical grain.

19 Claims, 5 Drawing Sheets

COLOR SORTING OF LUMBER

This application is a Continuation In Part of application Ser. No. 07/302,337, filed Jan. 27, 1989, now abandoned.

FIELD OF THE INVENTION

The present invention relates to color sorting based on the color of the surface of the piece of wood and where desired to divide wood pieces having significantly different colors into smaller elements of the selected different colors and/or collecting elements of the selected different colors in different groupings. The present invention also relates to sorting a piece of wood based on whether the surface has flat or vertical (edge) grain appearance and where desired to divide wood pieces having significantly different grain appearance (flat or vertical) into smaller elements having substantially only flat or vertical grain appearance and/or collecting elements of flat and vertical grain appearance in different groupings.

BACKGROUND OF THE PRESENT INVENTION

In finger jointing of high value lumber elements particularly those used primarily for decorative purposes, for example cedar blocks, it is important that the resultant product be homogeneous both in wood color and slope of the grain to provide a uniform, pleasing, visual appearance.

The concept of recognizing the color in different areas of a piece of lumber is not new. Such a process has been used for example in discriminating defects (e.g. knots, dark spots, etc.) and determining the location of these defects in a piece of lumber and the lumber then sawn on the basis of the location of such defects to remove or minimize the effect of the defects in the value of the lumber pieces.

It has also been proposed in Canadian patent No., 719,067 issued Oct. 5, 1965 to Finlay to use the intensity of reflected light to detect defects (by color) and to cut these defects from the wood. This patent refers to color sorting but no means for actual sorting are disclosed and no mechanism for discerning more than a color representing a defect in the background of the wood or lumber product is described.

The concept of detecting grain and particularly cross grain and in some cases torn grain using ultrasonics or microwaves coupled with light shadow techniques has also been suggested (see Szymani and MacDonald article entitled 'Defect Detection in Lumber'State of the Art Forest Products Journal, Volume 31, No. 11, November, 1981).

BRIEF DESCRIPTION OF THE PRESENT INVENTION

It is an object of the present invention to provide a means for discriminating areas of the surface of a wood element and classify same by color.

It is also an object of the present invention to provide a means for discriminating areas of the surface of a wood element and classify same by grain appearance.

Broadly the present invention relates to a method of sorting wood pieces by color comprising scanning a surface of said wood piece using a scanning camera, generating separate red and green (and optionally blue) image data from said camera while moving said surface of said wood piece past said camera, synchronizing said camera with said wood piece to correlate the acquisition of frames of said red, green and, if used, blue image data relative to the position on said surface from which it is generated, each said frame representing one of a plurality of increments of length along said surface, processing said data from each of said red and green color images by developing a histogram of frequency distribution of color intensity for each said red and green colors for each of said frames and analyzing said histograms for each of said frames to determine a designated color for each of said frames, characterizing each said increments of length based on said designated color for its respective of said frames and activating a sorter to segregate wood pieces of selected colors identified by said analysis into their selected bins.

Preferably said designated colors are determined based on the mean values from the histogram for each of said colors.

Preferably means will be provided to separate a given wood piece into a plurality of pieces based on colors present in said frames of length by severing said wood piece in the area of change of color from one selected color to another.

Preferably the camera will be a line scan camera acquiring data one line at a time transverse to the direction of movement of the wood piece relative to the camera, and each said frame will comprise a scan of a plurality of lines covering a significant increment of length (generally of at least about one inch) in the direction of movement of the wood piece relative to said camera.

In some cases the data will comprise more than one significant color peak in the histogram for one or more of said colors in one of said frames and the cut-off means may be actuated to sever said wood piece in the area of said piece corresponding to the location of said change within the respective color image data. The cutting location within a frame of data representing a discrete length is determined by examining a profile extending in the direction of travel of the wood piece relative to the camera for at least one of said colors. Normally this profile will be along or adjacent the axial centre line of the wood piece. Where a color change occurs, a profile will contain two signal levels corresponding to the two intensity levels representing each color component. The point at which the one level changes to another will establish the location to be chopped and will be used to activate the cut-off mechanism.

Preferably each of the histograms will be smoothed to reduce the noise to signal ratio and then convoluted with a second derivative Gaussian function to provide a series of zero crossings which define a color distribution.

Broadly the present invention also relates to a method of sorting wood pieces by surface grain orientation comprising scanning a surface of said wood piece using a scanning camera, generating selected red, green or blue image data in the case of a color camera or a grey scale image data in the case of a black and white camera from said camera while moving said surface of said wood piece past said camera, synchronizing said camera with said wood piece to correlate the acquisition of frames of image data with the position on said surface from which said frame is generated, each said frame representing one of a plurality of increments of length along said surface, processing said selected image data by developing a histogram of frequency versus intensity for each said frame and analyzing said histograms for each of said frame to classify same as representing a surface having a vertical or flat grain and activating a sorter to segregate wood pieces having vertical grain from those having flat grain.

Preferably the data will be classified as representing vertical grain or flat grain based on analysis of the frequency distribution of histogram and determining the frequency variability of the frequency distribution for each frame and declaring those frames as having a frequency variability below a selected threshold as representing vertical grain and those above said threshold representing flat grain.

Preferably the camera will be a color camera and said selected color will be green when a color camera is used and color is being examined.

Preferably means will be provided to separate a given wood piece into a plurality of pieces based on their classification of having vertical vs. flat grain by severing said wood piece in the area of change between flat and vertical grain.

Preferably the camera for grain detection will be a line scan camera acquiring data one line at a time transverse to the direction of movement of the wood piece relative to the camera, and each said frame will comprise a scan of a plurality of lines covering a significant increment of length (generally of at least about one inch) in the direction of movement of the wood piece relative to said camera.

BRIEF DESCRIPTION OF THE DRAWINGS

Further features objects and advantages will be evident from the following detailed description of the preferred embodiment of the present invention taken in conjunction with the accompanying drawings in which.

DESCRIPTION OF THE PREFERRED EMBODIMENT

Figure 1:
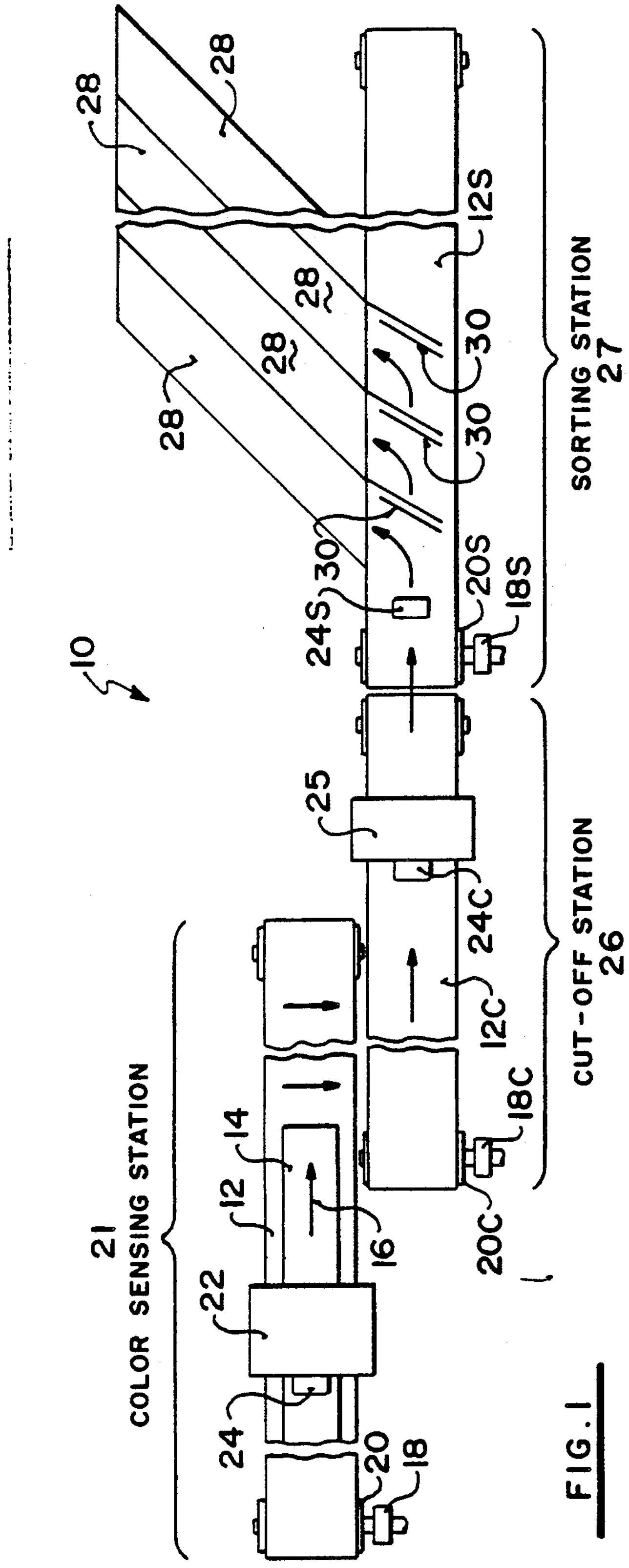
FIG. 1 is a schematic plan view illustrating a layout of stations forming the present invention.
Figure 2:
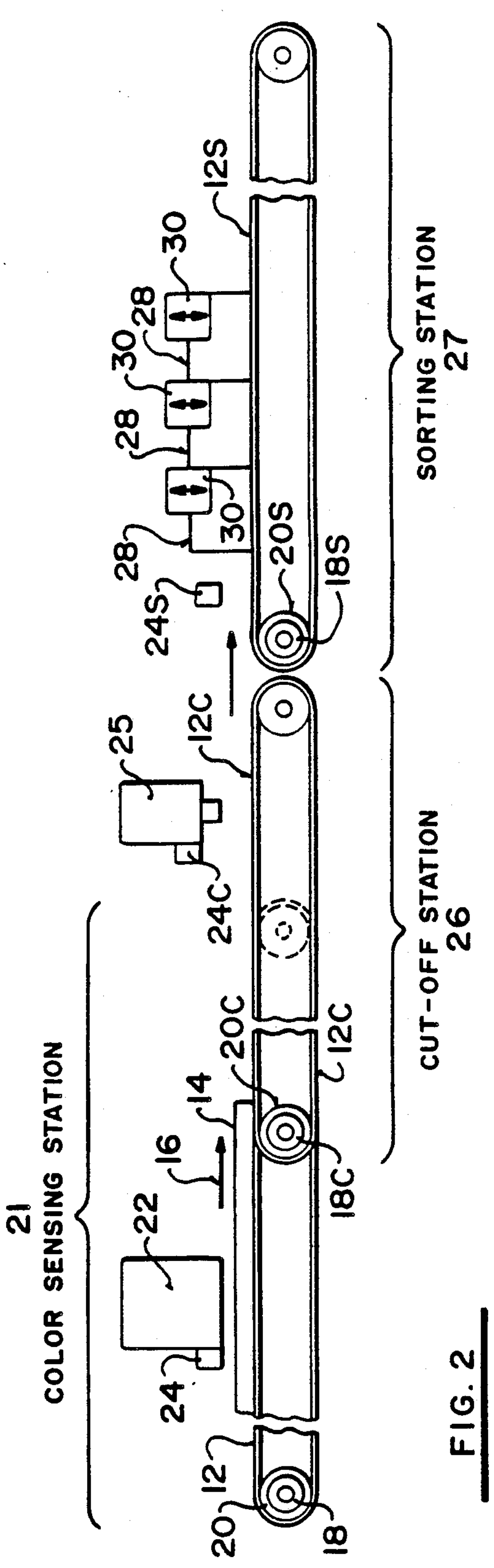
FIG. 2 is a schematic side elevation illustrating the layout of the stations of FIG. 1.

As shown in FIGS. 1 and 2 the sorter 10 comprises a main conveyer 12 for carrying the elements 14 in the direction of the arrow 16 through the various stations of the present invention. As illustrated schematically the conveyer 12 is provided with an encoder 18 which registers the position of the conveyor 12, i.e. by registration of the angular movement of the roll 20 over which the conveyor belt travels.

The encoder 18 at any given point in time codes the specific location of any selected point on the conveyor 12 so that the location of any point on wood pieces 14 travelling with the conveyor 12 may be determined when the location of a known point on the wood pieces 14 is established on the conveyor 12.

The sorter 10 incorporates a sensing station 21 that incorporates a camera 22 that images the surface of the wood pieces 14. The operation of the camera is synchronized with the movement or location on the conveyor 12 by a suitable sensor 24 that triggers operations when it senses preferably the leading edge of each of the pieces 14 or alternatively some specific marking on each of the pieces 14 to position each of the pieces relative to the conveyor 12 and thereby provide the necessary information to accurately position these pieces relative to the conveyor 12 using the data generated by the encoder 18 and thereby define any location along the length of the wood piece 14, i.e. distance from point of triggering of the sensor 24.

The other main elements of the present invention illustrated in FIGS. 1 and 2 include a cut-off station 26 and a sorting station 27. Each of these stations 26 and 27 have their own conveyor 12C and 12S respectively with encoder 18C and 18S and sensor 24C and 24S respectively equivalent to the conveyor 12, encoder 18 and sensor 24. The data from all the sensors, i.e. encoder 18, 18C and 18S, and sensors 24, 24C and 24S is sent to a tracking section 35 of the main computer control 34 and the information generated in color sensing station 21 by the sensor 24 and encoder 18 is supplied to the stations 26 and 27 via computer section 35 and used to control their operations and define accurately the position of the various pieces 14 on the conveyors 12C and 12S so that chopping and/or sorting occurs at the correct location.

The cutoff station 16 is provided with suitable cutoff chopper 25 or the like and the sorting station 27 incorporates a plurality of bins 28 each of which in the illustrated system has a deflector mechanism 30 actuated to selectively direct wood pieces into its respective bin 28.

The camera 22 may either be an area scan camera or preferably will be a line scan camera and preferably will use a charge coupled device (CCD) as a sensor for the color image. A black and white camera is adequate for sensing grain but generally in a given installation the same camera will be used to substantially sort by grain and color.

Color Sorting

The data for each of the red, green and blue signals from camera 22 is digitized in the digitizer 32, there being one digitizer for each color, the individual digitizer being designated by 32 followed by the letter R, G and B representing red, green and blue respectively.

The operation of an area scan camera is slightly different from that of a line scan camera. However in both cases the actuation of the data acquisition is continuous during the movement of the wood pieces 14.

The sensor 24 alerts the main control computer or CPU 34 to activate the triggers 36 for each of the buffers 38 there being one trigger and one buffer 38 for each of the signals and the corresponding triggers and buffers 38 are each indicated by the respective numbers of 36 and 38 followed by the initial R, G, and B to signify red, green and blue respectively. These buffers 38 store the data generated by the camera on command by the CPU 34 which activates the trigger 36 so that the data accumulated in each buffer can be correlated with a specific location on the surface of the wood pieces through the combined position sensing operation of the encoder 18, sensor 24 and a tracking section 35 in the CPU 34.

Similarly there is an analyzer 40 provided for each of the red, green and blue signals as indicated by the reference numerals 40R, 40G and 40B. The data from the buffers 38R, 38G and 38B is fed to the analyzers 40R, 40G and 40B respectively. Histograms are generated in the analyzers for each frame of data and these histograms are processed in the main computer 34 to operate the cut-off station control 39 which operates the chopper 25 and the sorting station control 44 which operates the various gates 30 for the bins 28.

Figure 4:
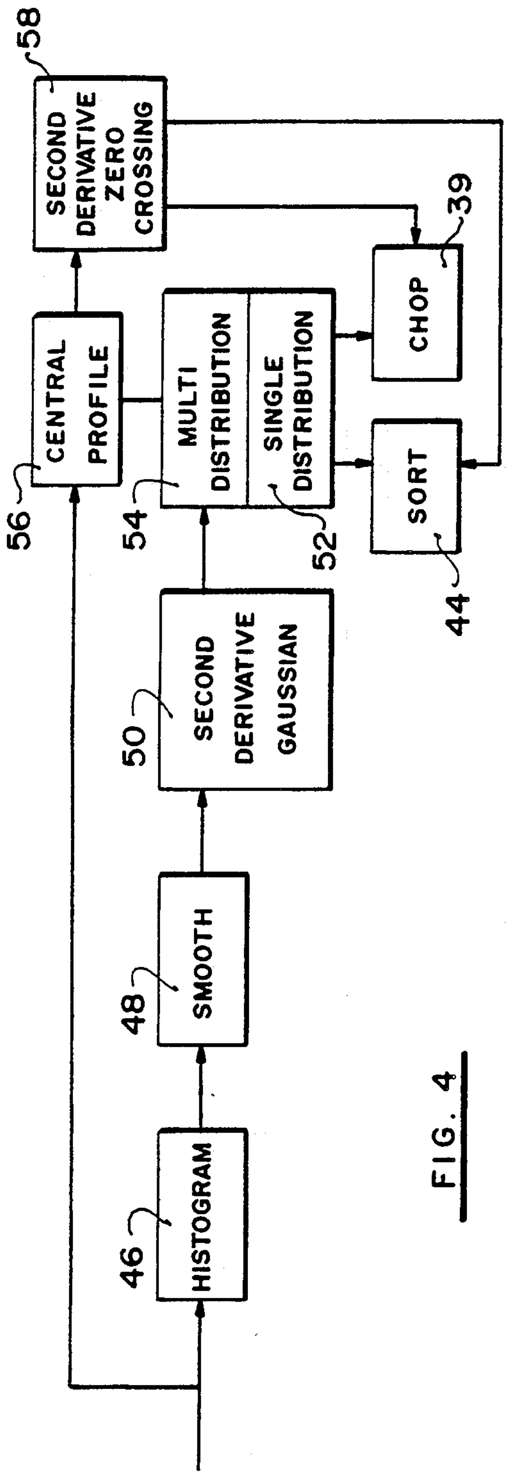
FIG. 4 is a schematic illustration of the processing of the data for color sorting.

The analyzers 40R, 40G, and 40B are essentially the same and the sequences carried out by each analyzer 40 are indicated in conjunction with the main computer 34 in FIG. 4. (If desired instead of a plurality of analyzers 40 the image from the buffers may be multi-plexed one at a time to an analyzer to produce histograms and these histograms read by the CPU 34 for color analysis.)

As shown in FIG. 4 each frame of input data from the buffer 38 is first histogrammed as indicated at 46. The histogram produced is a histogram of frequency versus intensity as detected by each of the elements within the CCD of the camera. Regardless of the type of camera used the number of discrete intensity readings in each increment of length (frame) will depend on the size of the CCD matrix of the camera (the number of CCD elements). When using a line scan camera each discrete length of surface scanned for each histogram generation i.e. each frame of data processed in the data processing stage when the line scan camera is used will represent a statistically significant length which will generally be at least one inch measured in the direction of relative movement of the camera and wood piece (the width will normally correspond to the width of the wood piece measured perpendicular to the direction of relative movement).

When an area scan camera is employed, each frame of data, i.e. each histogram will represent an area of the surface of the wood piece equivalent in length to the length of the field of view of the camera in the direction of movement of the wood pieces (at least one inch) plus the distance the wood piece travels relative to the camera in the time required to obtain the frame of data (which normally will be negligible as will be described below) and the camera 22 and digitizer 38 will be triggered at discrete intervals to produce frames of data representing abutting areas of the wood pieces. Obviously if triggering occurs at regularly spaced intervals and the rate of relative movement changes the length of travel between triggering will change. If all of the surface is to be analyzed or if extra or reprocessing of data is to be avoided triggering should be correlated with rate of travel.

Triggering of the camera occurs during the vertical retrace period of the camera and will normally also trigger activation of a strobe light or a shutter to expose the CCD of the camera to the image area for a time short enough to insure blurring of the image is not beyond the acceptable degree, i.e. the CCD may be exposed to the light receive light from the surface over a period of 3 to about 10 milliseconds for a relative speed of the lumber passed the scanner of up to about 400 feet per minute. As the speed is increased in order to maintain the same resolution the exposure time must be decreased, i.e. the increased shutter speed or time during which the strobe light is activated must be decreased. When a strobe light is used in this manner the ambient light must not be strong enough to interfere significantly with the clarity of the image.

The area viewed by each element of the CCD will generate a separate intensity and the number of CCD elements having a given intensity will be represented in the histogram. The histogram may then be smoothed by convoluting a Gaussian function with the histogram. A width of 15 and a sigma of 2 for the Gaussian function have been found satisfactory. Such a smoothing operation is schematically indicated at 48. The second pass through the histogram is a convolution of the second derivative Gaussian as indicated at 50 which will determine a series of zero crossings such that each adjacent pair of zero crossings define a distribution (predominant color) and separate distributions will be determined. The smoothing and convolution operations 48 and 50 will normally be carried out in the main CPU 34.

Figure 3:
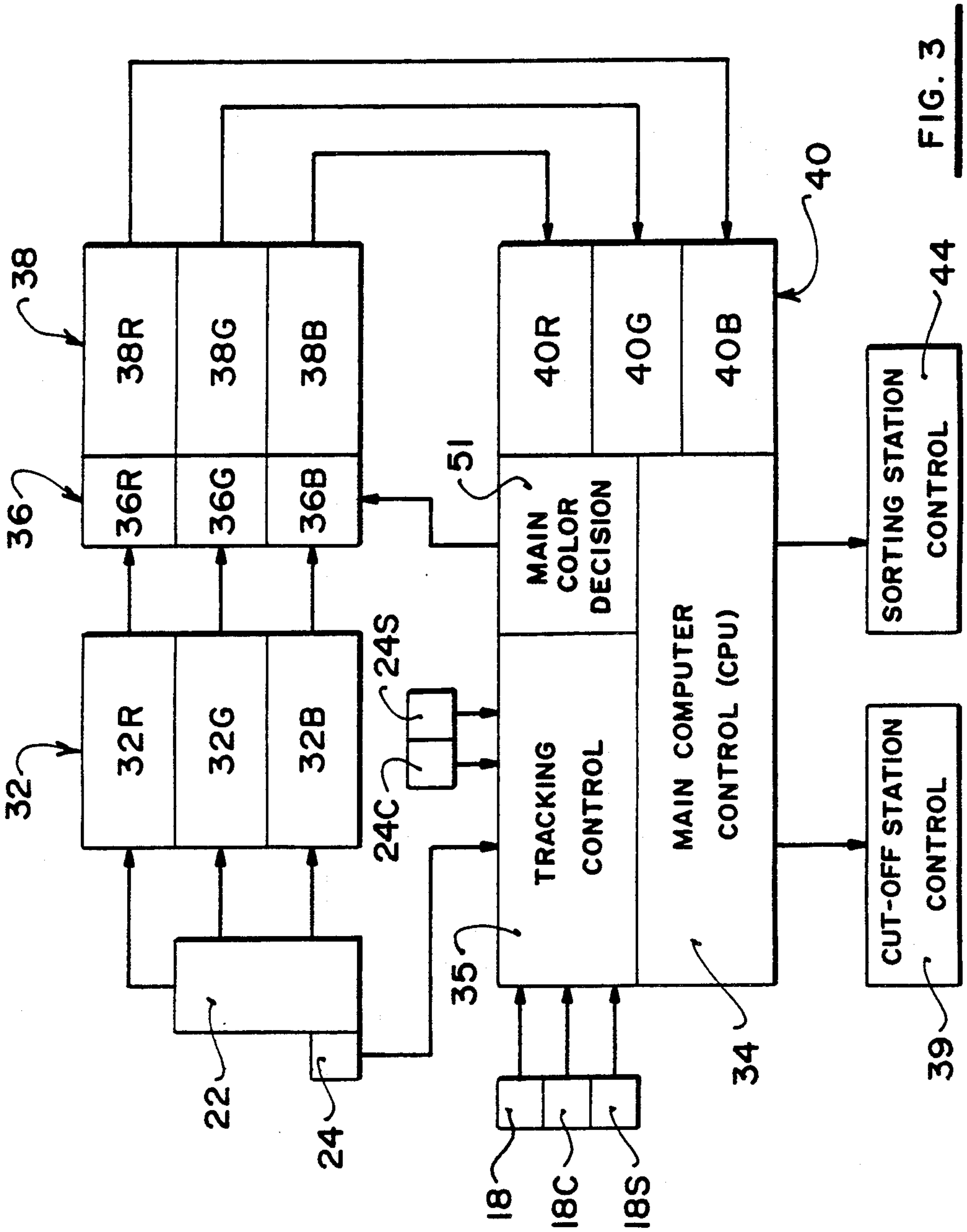
FIG. 3 is a schematic illustration of the data acquisition and computer control of the color sorter of present invention.

The main control computer 34 also determines what the main color distribution of each histogram is and its main color component as indicated at 51 in FIG. 3.

Figure 5:
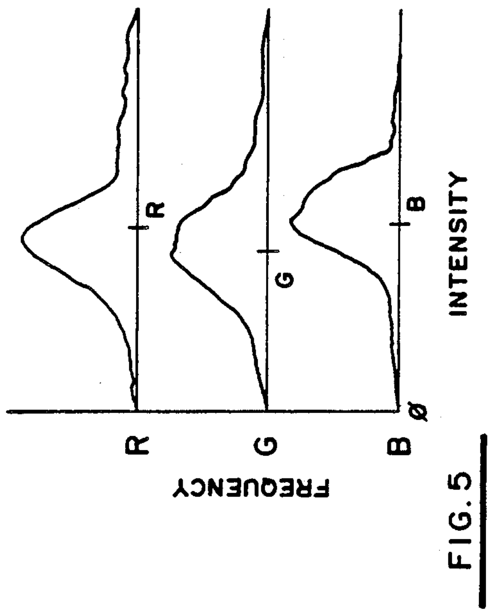
FIG. 5 is a typical histogram of a single-colored discrete length of a surface being analyzed.

In most cases there will only be a single color distribution likely for each of the color channels thereby indicating a single mean color for the frame of data being processed. Such curves are illustrated for example in FIG. 5 showing one major peak in the distribution for each of the colors red, green and blue. In this case the area of the wood piece will be classified based on the mean color for that area and as long as the mean color of the whole wood element does not deviate significantly that whole wood element will be sorted into a selected bin.

On the other hand, if the color shifts, i.e. the locations of the red, green or blue peaks or all of them shift significantly indicating a change in color provided that change in color is deemed significant based on pre-established color sorting criteria, the cut-off station 26 is activated at the appropriate location to cause the chopper 25 to separate the areas of different colors the location of which in each of the stations 21, 16 and 27 is defined in the tracking section 35 of the computer 34. Knowing the location of the board pieces of different color permits the sorting control 44 to activate the deflectors 30 at the appropriate time to direct different colored pieces into their respective bins 28.

Figure 6:
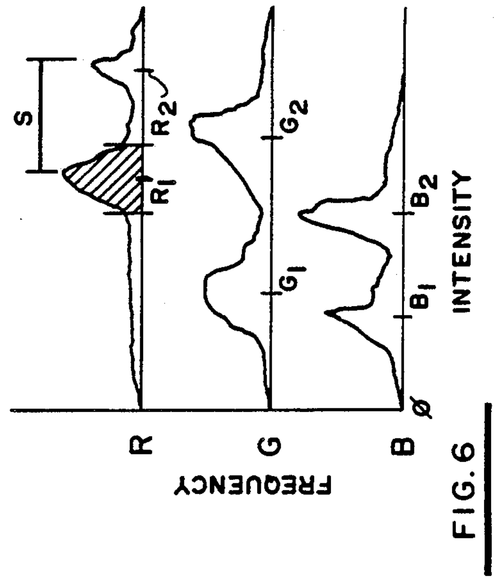
FIG. 6 is a histogram of a discrete length of a surface being analyzed and having two distinct colors.

In some cases a single frame of data, i.e. the data being processed at any one time, will incorporate more than one predominant color. This will appear in the histogram by a pair of peaks (see FIG. 6) with their distributions being segregated by the zero crossings determined by the second derivative Gaussians. This multi-peak or generally two peak distribution need not be found for all three colors but may be present in only one color and yet indicate a significant change in color.

The degree of separation between the peaks in a single histogram (see distance S in FIG. 6) and the area they represent in the image (e.g. hatched area) determines whether the two colors are high contrast relative to each other and the percentage of the surface area or frame being sensed that is of a different color, i.e. the significance of the color change. This information is then used to make a chop decision as to whether or not a cut should be made in the wood piece correlated using separate areas of different color.

When there are several different colors in a given frame (FIG. 6) its classification may be determined in a number of ways. The preferred system is to generate a central profile of one of the colors (preferably green) oriented parallel to the direction of travel in a profile generator 56 (FIG. 4). A color change in a frame will result in a color profile containing two signal levels corresponding to the two intensity levels representing each color. The location where one level changes to another will establish the location for actuation of the chopper 25. The precise location of this change in level can be determined, for example, by taking the second derivative of such central color profile as indicated at 58 and basing the chop on the zero crossing of the second derivative. The calculation of this chop location based on the sensing of two different colors can be carried out in the main computer.

The above description has related to analysis of all three color channels, i.e. red, green and blue, however for many wood species the color of the wood is represented predominantly by the green and red colors with blue being almost insignificant in determining the actual changing color. With these wood species it is unnecessary to process the blue channel and thus the decision can be made for many species based on processing of the red and green signals only.

Grain Sorting

The description will be related to a color camera using a selected color as it is the more likely to be used. If a black and white camera is used grey scale will be used in place of color intensity.

Figure 7:
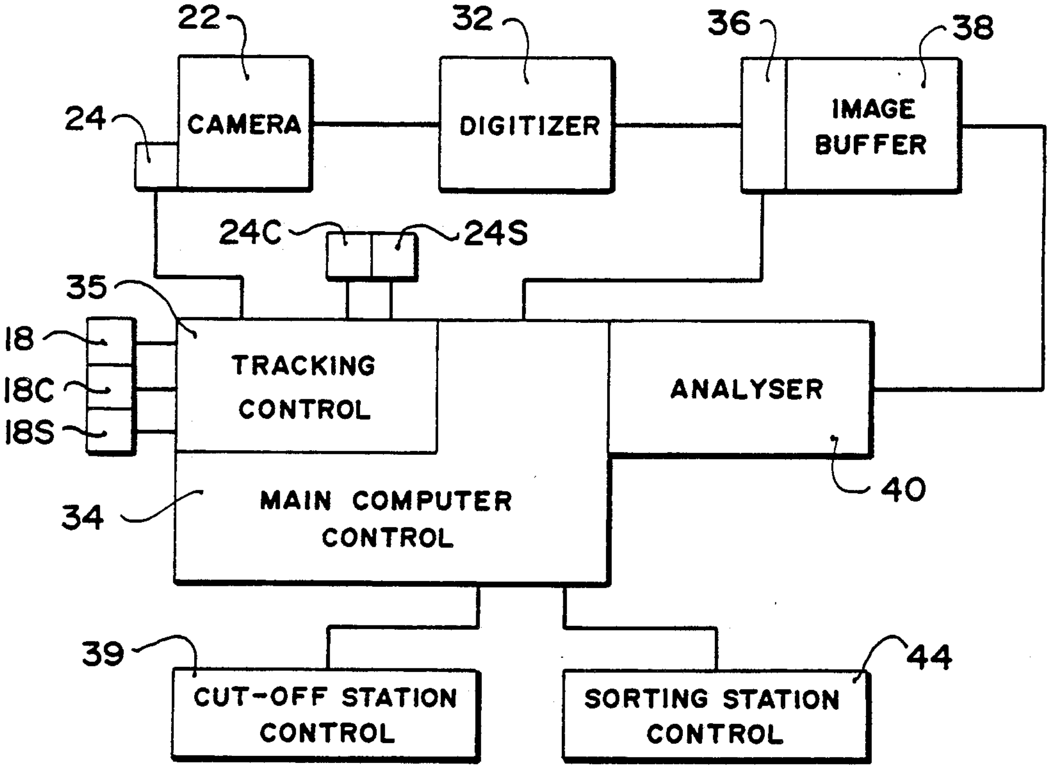
FIG. 7 is a schematic illustration of the data acquisition and computer control of the present invention.

The data for the selected color which for cedar preferably will be green (another color may be preferred for other wood species depending on their surface color and lighting used) is digitized in the digitizer 32 (see FIG. 7). The sensor 24 alerts the main control computer or CPU 34 to activate the trigger 36 for the camera 22 and buffer 38 and correlate the data for each frame with a specific location on the surface of the wood pieces through the combined position sensing operation of the encoder 18, sensor 24 and a tracking section 35 in the CPU 34. As above described the time of exposure is correlated with speed so that the image is not significantly blurred.

The data from the buffer 38 is fed to an analyzer 40 that develops a histogram for each frame of data and the histograms are processed in the main computer 34 to classify the frame and to operate the cut-off station 26 control 39 which operates the chopper 25 and the sorting station 27 control 44 which operates the various gates 30 for the bins 28.

Figure 8:
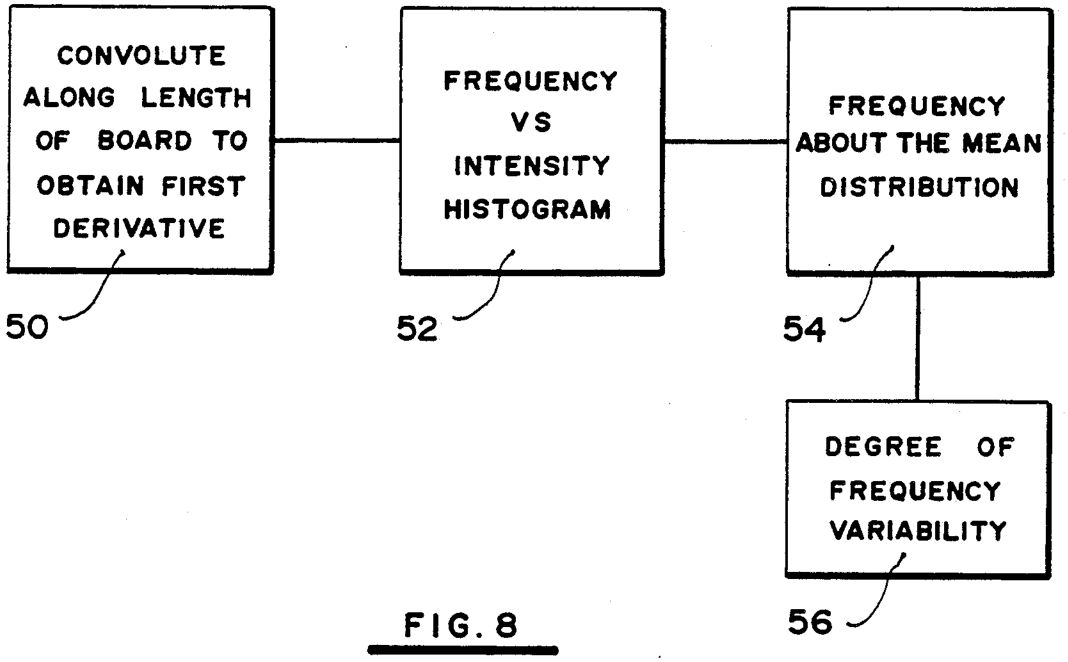
FIG. 8 is a schematic illustration of the processing of the data for grain sorting.

The sequence carried out by the analyzer 40 in conjunction with the main computer 34 is illustrated in FIG. 8.

When using a line scan camera each discrete length of surface scanned (frame) for each histogram generation i.e. each frame of data processed in the data processing stage will represent a statistically significant length which will generally be at least one inch measured in the direction of relative movement of the camera and wood piece (the width will normally correspond to the width of the wood piece measured perpendicular to the direction of relative movement).

When an area scan camera is employed, each frame of data, i.e. each histogram will represent an area of the surface of the wood piece equivalent in length to the field of view of the camera (at least 1 inch) plus the distance the wood piece travels relative to the camera in the time used to obtain the frame of data (generally only a very short if blurring is to be avoided) and the camera 22 and digitizer 38 will be triggered at discrete intervals to produce frames of data representing abutting areas of the wood pieces. Obviously if triggering were to occur at regularly spaced intervals and the rate of relative movement changes the length travelled between triggering will change. If all the surface is analyzed or extra or reprocessing of data is to be avoided triggering should be correlated with rate of travel.

Triggering of the camera occurs during the vertical retrace period of the camera and will normally also trigger activation of a strobe light or a shutter to expose the CCD of the camera to the image area for a time short enough to insure blurring of the image is not beyond the acceptable degree, i.e. the CCD may be exposed to the light receive light from the surface over a period of 3 to about 10 milliseconds for a relative speed of the lumber passed the scanner of up to about 400 feet per minute. As the speed is increased in order to maintain the same resolution the exposure time must be decreased, i.e. the increased shutter speed or time during which the strobe light is activated must be decreased. When a strobe light is used in this manner the ambient light must not be strong enough to interfere significantly with the clarity of the image.

As above indicated only one color from the camera 22 need be digitized and analyzed in the analyzer 40 when a color camera is used. For the remainder of this disclosure it will be assumed that it is the green color being processed but as above indicated other colors or grey scale (if a black and white camera is used) may be selected.

The green image is convoluted using a one dimensional, first derivative filter directed along the direction of board travel, i.e. along the length of the board since the board will be travelling in a direction parallel to its length to derive the first derivative as indicated at 50 in FIG. 4. In some cases it may be desirable to first smooth the image data using a suitable averaging kernel to convolute the image and generate an averaged image before subjecting the data to the one-dimensional first derivative filter.

The output of the one directional first derivative filter is histogrammed which represents a histogram of frequency versus intensity as indicated at 52 and a distribution is generated about a central mean which for most cases will be 128 (the twos complement of an 8 bit image). The resultant distribution is biased and contains negative components due to the first derivative calculation so that above the mean is in a positive range and below the mean is a negative range, i.e. for each histogram based on the central mean of 128 the mean of each histogram will always be at the selected 128 value and the degree of variability and distribution from this mean of 128 determines whether the board will be classified as having vertical or flat grain.

The frequency about the mean as indicated at 54 in FIG. 8 and the degrees of frequency variation is determined as indicated at 56 in FIG. 8.

It will be apparent that the first derivative obtained at 50 calculates the edge components sensed axially along the length of the board. In the case of a flat grain there are many edges that are generated and the first derivative will enhance those edges and subsequently generate a distribution with a high variability. A vertical grain board on the other hand will generally have the grain extending lengthwise of the board, i.e. in the direction of travel of the board which in turn is matched with the direction of the filter and hence will not generate any significant amount of edge response resulting in a frequency distribution about the mean that will have very low variability.

Figure 9:
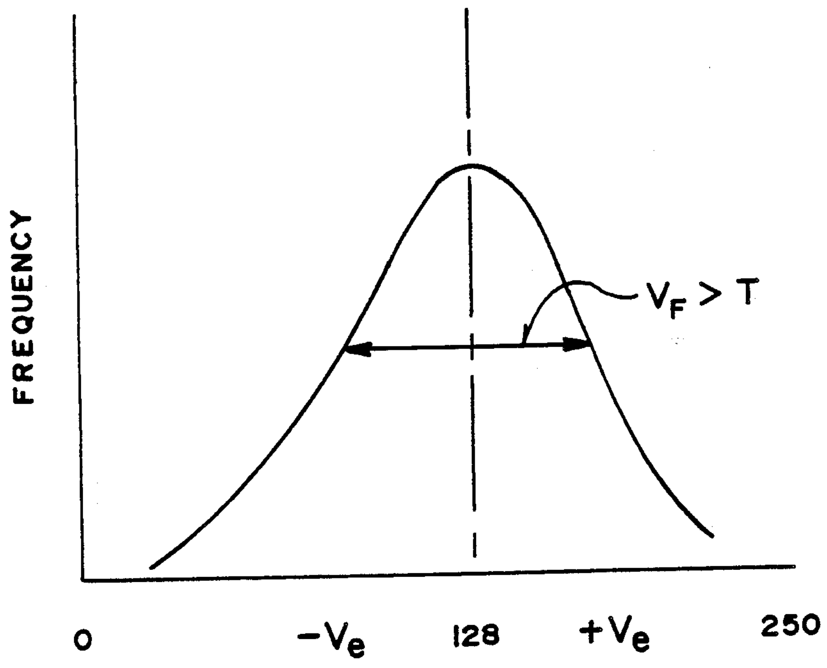
FIG. 9 is a typical histogram of a single-colored discrete length (frame) of a surface being analyzed having flat grain.
Figure 10:
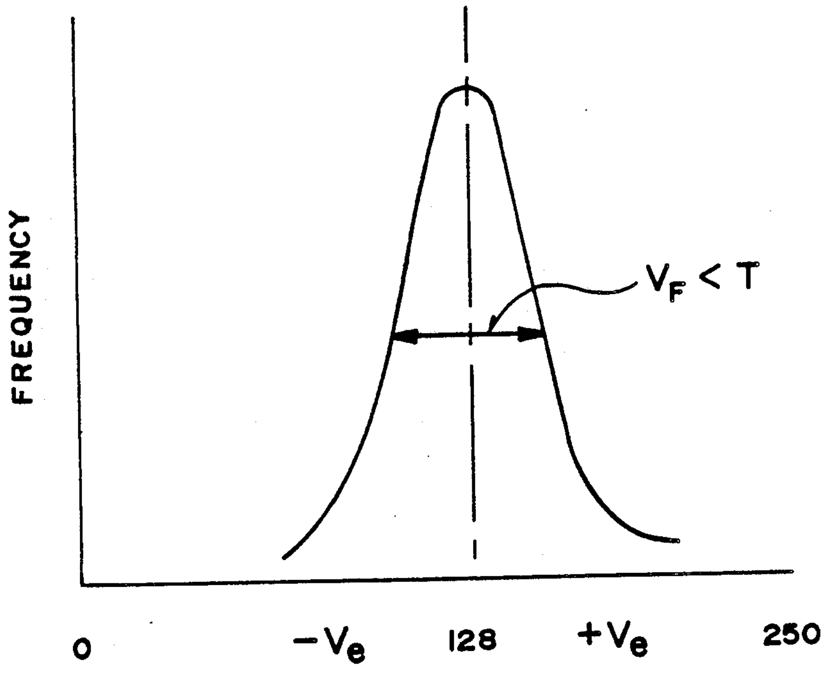
FIG. 10 is a histogram of a discrete length of a surface being analyzed having vertical grains.

To discriminate flat grain from vertical grain a threshold value T is selected and boards exhibiting a degree of frequency variability greater than the selected T will automatically be classified as flat grain (see $V_F$ in FIG. 9) and those with a variability of less than the selected threshold value T (see $V_V$ in FIG. 10) will be designated as vertical grain. The value T will be determined empirically for any species.

The cutoff station control 39 will be activated when the classification of the grain from one frame is different from that of the following frame to cut the board at the junction between the two frames which as above indicated is established by the encoders 18 and 18C operating in conjunction with the sensors 24 and 24C and the tracking control 35.

Similarly the sorting station control 44 will be actuated to direct pieces of board having vertical grain to one sort bin 28 and those having flat grain to a second bin location of these pieces of different grain being coordinated via the sensors 24 and 24S and the encoders 18 and 18S so the location of each board section is known throughout the equipment and the sorting bins be actuated accordingly.

Combined Sorting

It will be apparent that the same scanning and positioning equipment may be used for color sorting and grain sorting by handling the information in two different ways as described above for grain and color sorting and combining the results to chop and sort the wood in accordance with both grain and color.

Having described the invention modifications will be evident to those skilled in the art without departing from the spirit of the invention as defined in the appended claims.

I claim:

1. A method of sorting wood pieces by color comprising scanning a surface of a wood piece using a scanning camera, generating at least separate red and green image data from said camera while moving said surface of said wood piece past said camera, synchronizing said camera with said wood piece to correlate the acquisition of frames of said red and green image data with their position on said surface, each said frame representing one of a plurality of increments of length along said surface, processing said image data from each of said red and green color images by developing a histogram representing frequency distribution of color intensity for each of said red and green colors for each of said frames, analyzing said histograms for each of said frames to determine a designated color for each said frame, characterizing each said increment of length based on said designated color for its respective frame and activating a sorter to segregate wood pieces of selected colors into selected bins.

2. A method as described in claim 1 further comprising detecting significant changes in color on said surface by analyzing said histograms and severing said wood piece in the area of change of color from one selected color to another.

3. A method as described in claim 1 wherein said scanning camera is a line scan camera and wherein each said frame represents an increment of length of said surface of at least one inch measured in the direction of relative movement of said wood piece and said camera.

4. A method as described in claim 1 wherein at least one of said histograms demonstrates more than one significant color, and wherein said method further comprises determining the location of said color change and cutting said wood piece in the area of said piece corresponding to the location of said color change.

5. A method as defined in claim 1 wherein histograms representing two consecutive discrete increments length of said surface indicate different selected colors and wherein said method further comprises cutting said wood pieces adjacent the junction of the areas of different colors on said surface to divide said wood piece.

6. A method as defined in claim 1 wherein said histograms are smoothed to reduce noise to signal ratio and then convoluted using a second derivative Gaussian function to provide a series of zero crossings to discriminate any color peak distribution changes.

7. A method as defined in claim 1 wherein said designated color for each said increment of length is based on mean values for said red and said green colors.

8. A method as defined in claim 1 further comprising generating blue color image outputs from said camera and processing said blue image data in the same manner as said red and green image data and wherein said designated color for each said increment of length is based on said mean values for said red, said green and said blue colors.

9. A method as defined in claim 2 further comprising generating blue color image outputs from said camera and processing said blue image data in the same manner as said red and green image data and wherein said designated color each said increment of length is based on said mean values for said red, said green and said blue colors.

10. A method as defined in claim 3 further comprising generating blue color image outputs from said camera and processing said blue image data in the same manner as said red and green image data and wherein said designated color each said increment of length is based on said mean values for said red, and green and said blue colors.

11. A method as defined in claim 1 further comprising further processing a selected one of said image data, processing said selected image data by developing a histogram representing frequency distribution of intensity for each said frame extending along the direction of relative movement of said wood piece and said camera, analyzing said histograms for each of said frames to characterize each said frame and said increment of length if represents as vertical or flat grained and activating a sorter to segregate wood pieces into vertical and flat grained pieces.

12. A method of sorting wood pieces by surface grain orientation comprising scanning a surface of a wood piece using a scanning camera, generating a selected red, green, blue or grey scale image data from said camera while moving said surface of said wood piece past said camera, synchronizing acquisition of said data with said wood piece to correlate the acquisition of a frame of image data with the position on said surface from which said frame of data is generated, each said frame of said image data representing one of a plurality of increment of lengths along said surface, processing said selected image data by developing a histogram representing frequency distribution of intensity for each said frame extending along the direction of relative movement of said wood piece and said camera, analyzing said histograms for each of said frames to characterize each said frame and said increment of length it represents as vertical or flat grained and activating a sorter to segregate wood pieces into vertical and flat grained pieces.

13. A method as described in claim 12 wherein said scanning camera is a line scan camera and wherein each said frame represents an increment of length of said surface of at least one inch measured in the direction of relative movement of said wood piece and said camera.

14. A method as defined in claim 12 wherein histograms representing two consecutive discrete increments length of said surface on said wood piece are characterized as flat grained and the other as vertical grained colors and wherein said method further comprises cutting said wood pieces adjacent the junction of the areas of different grains on said surface to divide said wood piece.

15. A method as defined in claim 12 wherein said image data for each frame is convoluted in the direction of relative movement of said wood piece to said camera to obtain a first derivative before said histogram is developed.

16. A method as defined in claim 12 wherein the frequency distribution of said histogram is determined and wherein said length of said wood piece represented by said frame is characterized as flat grained if the degree of frequency of variability of said frequency distribution is larger than a pre-selected threshold value.

17. A method as defined in claim 15 wherein the frequency distribution of said histogram is determined and wherein said length of said wood piece represented by said frame is characterized as flat grained if the degree of frequency of variability of said frequency distribution is larger than a pre-selected threshold value.

18. A method as defined in claim 16 wherein said data is smoothed before being convoluted along its direction of relative movement.

19. A method as defined in claim 18 wherein the frequency distribution of said histogram is determined and wherein said length of said wood piece represented by said frame is characterized as flat grained if the degree of frequency of variability of said frequency distribution is larger than a pre-selected threshold value.

* * * * *